United States Patent [19]
Martin

[11] Patent Number: 5,701,010
[45] Date of Patent: Dec. 23, 1997

[54] DUAL BAND POLARITY REVERSING MULTIPLEXER

[75] Inventor: Robert J. Martin, Orlando, Fla.

[73] Assignee: Martin Marietta Corporation, Bethesda, Md.

[21] Appl. No.: 574,145

[22] Filed: Dec. 18, 1995

[51] Int. Cl.$^6$ .................................................. G01J 1/00
[52] U.S. Cl. ........................ 250/370.06; 250/339.01
[58] Field of Search .................... 250/370.06, 339.01, 250/339.02, 349, 370.01, 332; 257/184, 447

[56] References Cited

U.S. PATENT DOCUMENTS

| | | |
|---|---|---|
| 3,624,338 | 11/1971 | Ellis et al. |
| 4,989,114 | 1/1991 | Storti et al. |
| 5,113,076 | 5/1992 | Schulte ................... 250/370.12 |

Primary Examiner—David P. Porta
Assistant Examiner—Richard Hanig
Attorney, Agent, or Firm—Burns, Doane, Swecker and Mathis, LLP

[57] ABSTRACT

A detector array of a plurality of photodetector cells is provided which operates in two spectral bands by utilizing a polarity reversing multiplexer for directly reversing the polarity of different types of photodetector pairs. More particularly, long wave photoconductive quantum well detectors and near infrared photovoltaic detectors may be advantageously interconnected to supply the two detectors with different bias voltage levels by a polarity reversal function. This polarity reversal function exploits the low and high impedance characteristics of the detectors for enhancing the electrical interconnection. As a result, the system optimally changes the operation of the detector array from one photospectral band to another to take advantage of the electrical interconnection characteristics of both devices. As a further advantage, the circuitry used may be simplified for eliminating bias lines. Thereby, the fill factor of the sensor array is increased by reducing the number of connection nodes or bumps to bias lines which provides a larger active area for the sensor array.

5 Claims, 3 Drawing Sheets

DUAL BAND POLARITY REVERSING MULTIPLEXER

BACKGROUND OF THE INVENTION

1. Field of the Invention

The present invention is directed to a multiplexing system for reversing the direct polarity of dual band detector pairs in a detector array. More particularly, the present invention is directed to advantageously interconnecting long wavelength photoconductive quantum well detectors and near infrared photovoltaic detectors so that the two detectors are supplied with different bias voltage levels by a polarity reversal arrangement which allows exploitation of the low and high impedance characteristics of the detectors for enhancing the electrical interconnection therebetween.

2. Description of the Related Art

In two dimensional detector arrays, photodetectors employing a combination of photoconductive and photoelectric materials are typically used to detect optical signals through electronic processes. Extracting signals from a two dimensional detector array operating in dual spectral bands requires switching electronics for supplying the required potential to the appropriate type of detector. Polarity reversing transfer resistance techniques have commonly been used to bias the appropriate detector. One example of a circuit that provides polarity reversing transfer resistance characteristics is an electronic bridge circuit having double pole/double throw circuit functionality.

FIG. 1(a) illustrates an example of a known bridge circuit using four electrical connections to provide detector selection for a two dimensional detector array combining a near infrared photovoltaic detector 10 and a long wavelength photoconductive quantum well detector 20. The circuit illustrated in FIG. 1(a) includes two P-channel switching transistors 30 and 40 and an N-channel transistor 50. Transistors 30 and 40 act as switches and amplifiers. Transistor 50 functions as a biased amplifier or cell buffer.

The input stage is a common gate P-channel circuit configuration where the switching gate of the transistor 30 is connected to first transistor bias source 60 and the back gate is connected to $V_{DD}$. The source of the transistor 30 is connected to the long wavelength quantum detector 20 and the drain of the transistor 30 is connected to ground through a switch 70.

The drain of the transistor 30 is also connected to the drain of the transistor 40. The switching gate of the transistor 40 is connected to a second transistor bias source 80. The back gate of the transistor 40 is connected to $V_{DD}$. The source of the transistor 40 is connected to the near IR photodetector 10. The drain of the transistor 40 is connected to ground through a capacitor 90.

The drain of the transistor 40 is also connected to a switch 100. Closing the switch 100 completes a connection between drain of the transistor 40 and the switching gate of a transistor 50, which is also connected to ground through a capacitor 110. The source of the transistor 40 is connected to $V_{DD}$ and the back gate is connected together with the drain of the transistor 50 to switches 120 and 130 which may be, for example, row and column select switches. When the switches 120 and 130 are closed, the drain and back gate of the transistor 50 are connected to the noninverting input of an operational amplifier 140. The arrangement also includes a constant current sink 150 connected to the noninverting input of the operational amplifier 140.

As mentioned, this arrangement uses four electrical connections or "bumps" to make external connection to the detecting elements for biasing and control signals. In particular, the near IR photodetector 10 has two bumps, a first bump 160 to which a first bias voltage is applied, and a second bump 170 for applying a bias/control signal to the other side of the near IR photodetector 10. Similarly, the long wavelength quantum detector 20 is also bracketed by two bumps, a third bump 180 to which a second bias voltage is applied, and a fourth bump 190 for applying a bias/control signal to the other side of the long wavelength quantum detector 20. FIG. 1(b) shows a functional equivalent of this circuit. These bumps are formed by depositing indium at the desired node so that the node may be connected to the appropriate bias or control line.

These multiple bump schemes quickly lead to a large number of bumps in the detector array, which have a large number of elements (480×640 elements, for example), as the bumps are directly proportional to the number of elements in the detector array. The manufacturing yields of the arrays are directly affected by the number of these indium bumps as cold fuses result from pressure. Furthermore, vias to the detectors are necessary for these bumps which increase the area filled on the chip. Because the fill factor (the active area) in the sensor array is directly related to the number of bumps, the fill factor is undesirably reduced as the number of bumps in the detector array increases. For example, the known circuit using a four bump scheme has a fill factor of approximately 77%.

Another problem resulting from using a large number of bumps in the detector array is a reduction in the manufacturing yield of the array. Because the indium bumps are highly susceptible to a cold fuse from pressure, a higher number of bumps increases the probability that a cold fuse will occur in the detector array. Accordingly, a reduction in the number of bumps will increase the manufacturing yield of the array.

It is possible to have an arrangement in which there are only three bumps per detector pair. Such an arrangement is shown functionally in FIG. 1(c), where the two detectors share a common bump. It remains desirable, however, to decrease the number of bumps still further.

It is desired to provide an interconnection system for connecting detectors of different photoconductive and photoelectric materials in a two dimensional detector array which takes advantage of the electrical interconnection characteristics of both devices. A mechanism is desired for optimally changing the function from one photospectral band to another and changing between photoconduction and photovoltaic operating modes. It is further desired to accomplish this interconnection with circuitry which lowers crosstalk between the detectors, eliminates bias lines, and provides a large active area in the sensor array.

SUMMARY OF THE INVENTION

These and other objectives are achieved in accordance with the present invention by means of a system for reversing the polarity when connecting detectors of two spectral bands in a two dimensional detector array. More particularly, the present invention is directed to interconnecting long wavelength photoconductive quantum well detectors and near infrared photovoltaic detectors by a multiplexing system which provides a direct polarity reversal of the detector pair. As a result, the low to high impedance ratio of the photovoltaic near infrared detector can be advantageously utilized to integrate the detectors in a two dimensional detector array.

As a further feature of the invention, the system is directed to reducing the circuit complexity required to extract a video signal from the two dimensional detector array which operates in either of two spectral bands and either photoconduction or photovoltaic modes. In this polarity reversing system, only two interconnecting contacts per detector are required and bias lines are eliminated. This polarity reversing transfer system increases the active area in the detector array and lowers the cross-talk between the detectors while reducing the circuit complexity.

BRIEF DESCRIPTION OF THE DRAWINGS

The present invention will become more fully understood from the detailed description given hereinbelow and the accompanying drawings which are given by way of illustration only, and thus are not limitative of the present invention, wherein.

DETAILED DESCRIPTION OF THE PREFERRED EMBODIMENTS

Figure 2:
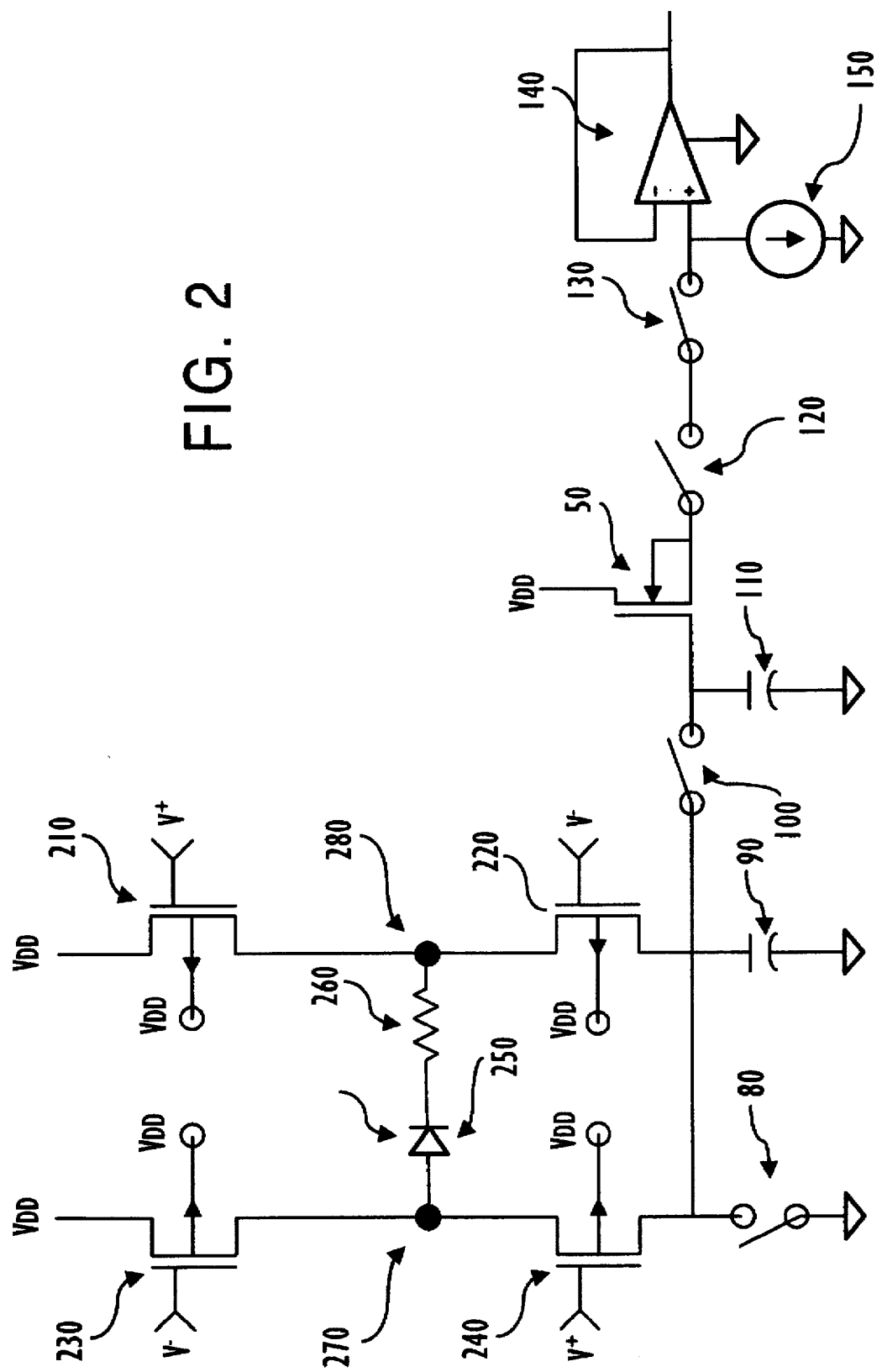
FIG. 2 illustrates a polarity reversing dual band multiplexing system for an embodiment of the present invention.

The embodiments of the present invention are directed to a system and mechanism for reversing the polarity of detector pairs in a two dimensional detector array which operates in either of two spectral bands and employs a combination of photoconductive and photoelectric materials. FIG. 2 illustrates an example of a polarity reversing system for one embodiment of the present invention. In this system, four P-channel transistors 210, 220, 230, and 240 are connected to a photodiode 250 and a quantum well 260 in a double pole/double throw scheme. In essence, the arrangement permits the series combination of the near infrared photodetector 250 and the long wavelength quantum detector 260 to be either forward biased or reverse biased, and so "read out" one or the other, depending on the conduction state of the transistors 210, 220, 230, and 240.

For example, a common switching voltage $V^+$ is applied to transistors 210 and 240 and a common voltage of an opposite polarity $V^-$ is applied to transistors 220 and 230 where the magnitude of the voltages are the same. This turns one diagonally crossed pair of transistors on and the other diagonally crossed pair off, setting up a first bias state for the series combination of the near infrared photodetector 250 and the long wavelength quantum detector 260. Also, the polarity of the common switching voltages $V^+$ and voltage $V^-$ applied to the transistors 210, 220, 230, and 240 may be inverted for setting up a second bias state for the series combination of the near infrared photodetector 250 and the long wavelength quantum detector 260.

It will be appreciated that an arrangement such as that shown in FIG. 2 makes it possible to have only two bumps, 270 and 280 in the figure. This makes it possible in turn to increase the fill factor of an array of paired detectors, and to increase manufacturing yields.

Figure 1A:
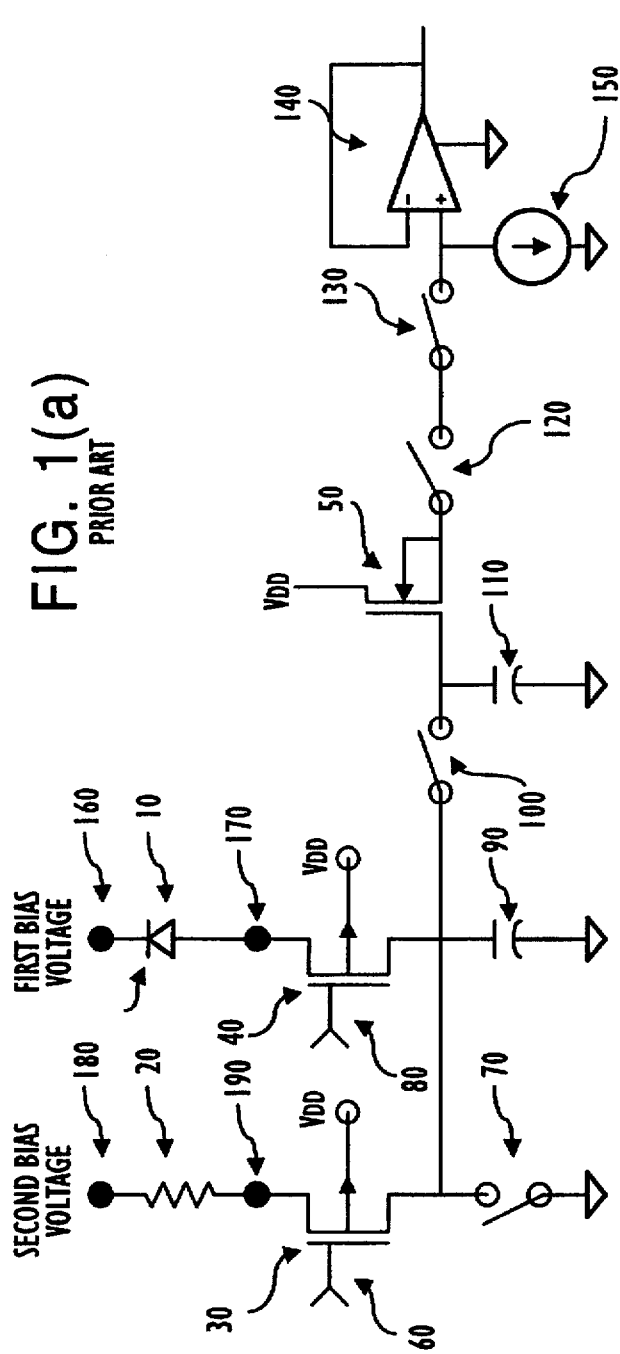
FIG. 1(a) illustrates a known double pole/double throw multiplexing circuit.
Figure 1C:
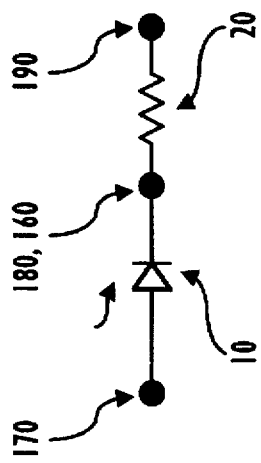
FIGS. 1(b) and 1(c) illustrate four and three bump schemes respectively.
Figure 1B:
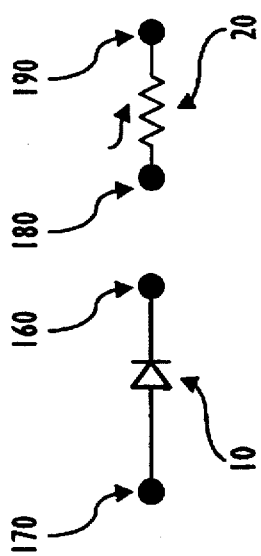

The drains of the transistors 220 and 240 may be connected to a read-out circuit the same as that shown in FIG. 1(a). That is, it may connected to a circuit network which includes a switch 80, a capacitor 90, a switch 100, a capacitor 110, a transistor 50, two switches 120, 130, an operational amplifier 140, and a constant current sink 150 arranged as shown. The arrangement can also include a temporal noise filter.

Because the detector bias is supplied through the relatively heavy power supply bus $V_{DD}$ and is set by the voltage on the input biases to the transistors $V-$ and $V+$, this circuitry allows the transistors 210, 220, 230, and 240 to supply bias to the detector pairs without any need for a detector bias line. Also, by modulating the inputs to the transistors, different bias levels may be provided for the separate detectors. As a result, this circuitry provides switching between the photodiode 250 and the quantum well 260 in response to the bias polarity for the photodiode 250. In particular, conductance is controlled by the quantum well 260 when the photodiode 250 has a forward bias polarity and, when the photodiode 250 is in a reverse polarity, the photocurrent is controlled by the photodiode 250. The spectral band is thereby changed by selecting which device is biased for dominating the photon detection function.

In FIG. 2, the detector bias is applied through the $V_{DD}$ bus. In an exemplary application, when the common voltage $V^-$ and $V^+$ is about 4.75 volts and $V_{DD}$ is about 8 volts, a 6 volt swing across the integration capacitor 110 is produced which will yield enough well capacity to meet the noise requirements of about 75 million electrons or 0.012 seconds per nA.

The circuitry illustrated in FIG. 2 supplies the bias voltages $V^+$ and $V^-$ to the detectors from each of the two input contacts depending on the bias $V^-$ and $V^+$ voltages to the bridge. The bias voltages $V^-$ and $V^+$ are logical complements so that when one of these voltages is low, the other voltage is high which produces a given polarity. The voltage level can be used to turn on the given polarity and also to control the magnitude of the voltage to the detectors as well. As a result, the near infrared detector 250 may have one bias voltage level while the quantum well detector 260 has a different bias voltage.

In effect, two additional input P-channel transistors are used in conjunction with the input P-channel transistors of the bridge circuit to implement the direct polarity reversing of the present embodiment. All of these transistors are minimum area devices and fit in the area resulting from the removal of the bias line bus which is made possible because the multiplexer supplies the bias to the detector. The detector bias is supplied through the relatively heavy power supply bus that runs through the multiplexer and is set by the voltage on the $V^-$ and $V^+$ bias and control lines. If different bias levels are desired for the separate detectors, the bias and control lines may be modulated.

Figure 3:
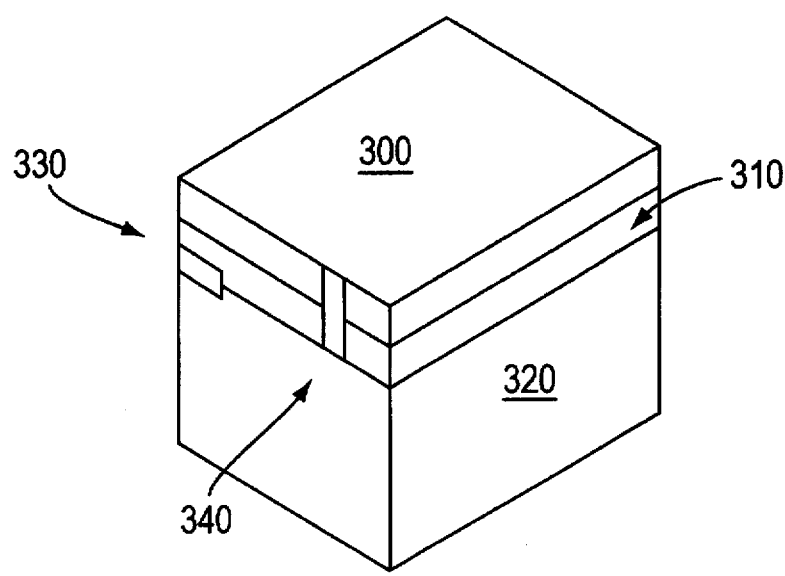
FIG. 3 illustrates an example of a read-out integrated circuit that may be incorporated into the polarity reversing multiplexing system in an embodiment of the present invention.

The read-out integrated circuit (ROIC) of the quantum well and the photodiode is a two contact scheme for the present embodiment. This means that the chip can be made smaller by using less area for these connections. FIG. 3 illustrates an example of an ROIC having a two contact scheme where a conductive film 310 separates the photodiode detector layer 300 and the quantum well photoconductive contact layer 320. A contact 330 for the quantum well and a contact 340 for the photodiode detector are also illustrated in this figure. Because the circuitry for the present embodiment implements ROICs having two contacts, the area on the chip that each ROIC cell takes up is reduced. For example, the size of the ROIC cell may be smaller than 24 microns and the chip size for a two dimensional detector array of 480×640 elements may be formed on a chip having a size of 13×17 ml or less.

Figure 4:
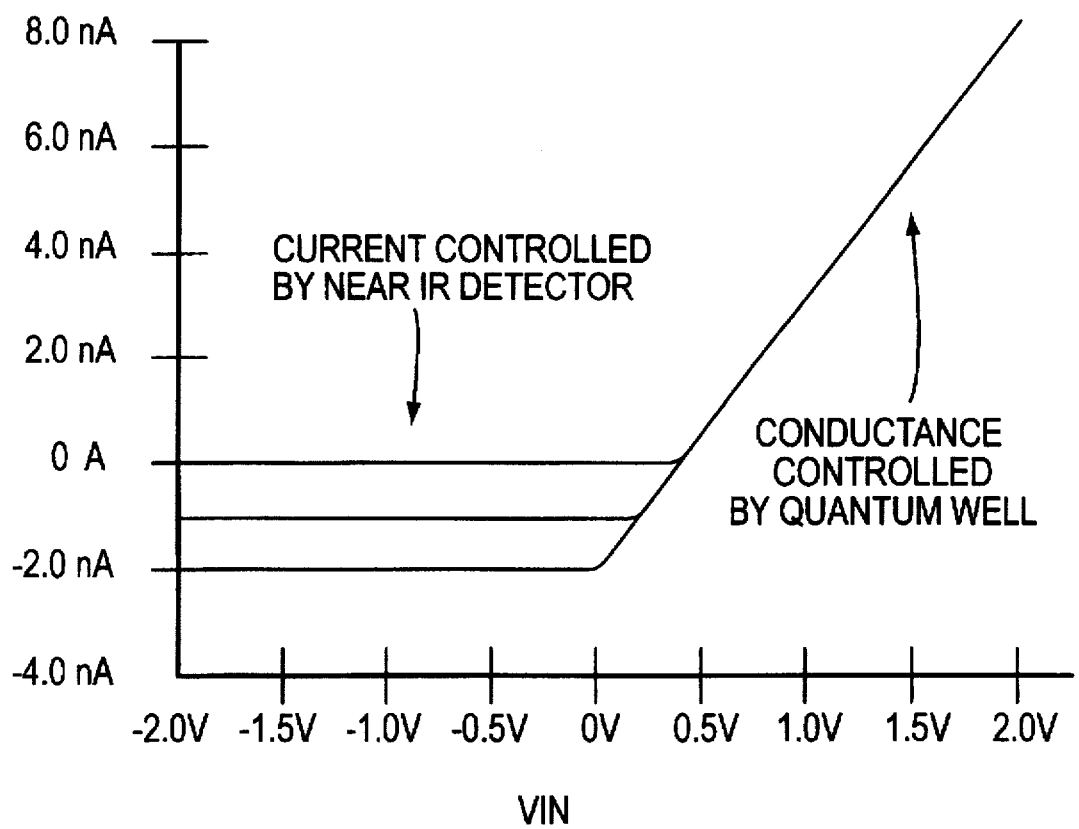
FIG. 4 illustrates the voltage and current characteristics for a quantum well detector and a near infrared detector system in an embodiment of the present invention.

FIG. 4 illustrates noise and bias characteristics of the dual detector and multiplexer interconnection system for an embodiment of the present invention. In order to illustrate these characteristics, a dual detector and multiplexer configuration was used (a series connection of a 200 Mohm quantum well and a near infrared detector having an energy gap of 0.8 volts is used at a temperature of −196° C. in this example). A current source was stepped in the reverse direction for the photodiode detector to demonstrate the photocurrent detection current. FIG. 4 illustrates the conductance being controlled by the quantum well in the forward bias polarity ($V_{IN}$ positive) for the near infrared detector. For a reverse polarity of the near infrared detector ($V_{IN}$ negative), the photocurrent is controlled by the near infrared detector. Thereby, the photodiode produces visible or near infrared images while the quantum well produces long infrared images.

By connecting the near infrared detector to the long wave photoconductive quantum well detector, with the polarity reversing transfer resistance techniques of the present invention, a two dimensional detector array may employ a combination of photoconductive and photoelectric materials to extract a video signal in either of two spectral bands. The circuitry is designed to require only two interconnecting contacts or bumps per detector pair and also to eliminate bias lines so that the cell size is reduced and a larger active area in the detector array is provided. Specifically, the active area in the detector arrays of the present embodiment are approximately 92% of the cell while the active area in the arrays presently used are approximately 77% of the cell. Furthermore, the cross-talk between detectors and the overall complexity of the circuit are reduced by the present polarity reversing transfer system. As a result, an enhanced display for the two dimensional detector array is provided by the present invention for producing improved output video signals and is especially applicable to improving night vision detection.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photodetector cell which is selectable to be responsive to radiation in a first spectral band or a second spectral band, said photodetector cell comprising:

a series opposed pair of a first photodetector responsive to radiation in said first spectral band and a second photodetector responsive to radiation in said second spectral band, said series opposed pair having a first end and a second end and being arranged so that when a first bias is applied across said series opposed pair through said first end and said second end, said first photodetector is in a photodetecting reverse biased state and said second photodetector is in a forward biased conducting state and when a second bias opposite to said first bias is applied across said series opposed pair through said first end and said second end, said second photodetector is in a photodetecting reverse biased state and said first photodetector is in a forward biased conducting state;

a first switching element for connecting said first end of said series opposed pair to a first potential only when said first switching element is in a conducting state;

a second switching element for connecting said second end of said series opposed pair to a second potential less than said first potential only when said second switching element is in a conducting state;

a third switching element for selectably connecting said second end of said series opposed pair to said first potential only when said third switching element is in a conducting state; and a fourth switching element for selectably connecting said first end of said series opposed pair to said second potential only when said fourth switching element is in a conducting state, such that said first bias is applied across series opposed pair when said first and second switching elements are both in said conducting state and said third and fourth switching elements are not in said conducting state and such that said second bias is applied across series opposed pair when said third and fourth switching elements are both in said conducting state and said first and second switching elements are not in said conducting state.

2. A photodetector cell according to claim 1, wherein said first photodetector, is a long wave photoconductive quantum well detector and said second photodetector is a photovoltaic near infrared photodetector.

3. A photodetector cell according to claim 1, wherein each of said first end and said second end comprises an indium bump.

4. A method of controlling a photodetector cell which is selectable to be responsive to radiation in a first spectral band or a second spectral band, said photodetector cell including a series opposed pair of a first photodetector responsive to radiation in said first spectral band and a second photodetector responsive to radiation in said second spectral band, said series opposed pair having a first end and a second end and being arranged so that when a first bias is applied across said series opposed pair through said first end and said second end, said first photodetector is in a photodetecting reverse biased state and said second photodetector is in a forward biased conducting state and when a second bias opposite to said first bias is applied across said series opposed pair through said first end and said second end, said second photodetector is in a photodetecting reverse biased state and said first photodetector is in a forward biased conducting state, and also including a first switching element for connecting said first end of said series opposed pair to a first potential only when said first switching element is in a conducting state, a second switching element for connecting said second end of said series opposed pair to a second potential less than said first potential only when said second switching element is in a conducting state, a third switching element for selectably connecting said second end of said series opposed pair to said first potential only when said third switching element is in a conducting state, and a fourth switching element for selectably connecting said first end of said series opposed pair to said second potential only when said fourth switching element is in a conducting state, said method comprising the alternate steps of causing said first and second switching elements to be in said conducting state and said third and fourth switching elements to not be in said conducting state to apply said first bias across series opposed pair and so to place said first photodetector in said photodetecting reverse biased state and said second photodetector in said forward biased conducting state; or causing said third and fourth switching elements to be in said conducting state and said first and second switching elements to not be in said conducting state to apply said second bias across series opposed pair and so to place said second photodetector in said photodetecting reverse biased state and said first photodetector in said forward biased conducting state.

5. A method according to claim 4, wherein said first photodetector comprises a long wave photoconductive quantum well detector and said second photodetector comprises a photovoltaic near infrared photodetector.

* * * * *